United States Patent
Bardsley et al.

(10) Patent No.: US 6,570,411 B1
(45) Date of Patent: May 27, 2003

(54) SWITCHED-CAPACITOR STRUCTURES WITH REDUCED DISTORTION AND NOISE AND ENHANCED ISOLATION

(75) Inventors: Scott Gregory Bardsley, Summerfield, NC (US); Ravi Kishore Kummaraguntla, Jamestown, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/174,909

(22) Filed: Jun. 17, 2002

(51) Int. Cl.[7] .......................... G11C 27/02; H03K 7/64
(52) U.S. Cl. .......................... 327/94; 327/337
(58) Field of Search .......................... 327/337, 91, 94, 327/95, 96, 77, 554; 330/9, 51; 341/122

(56) References Cited

U.S. PATENT DOCUMENTS

| | | | | |
|---|---|---|---|---|
| 4,543,534 A | * | 9/1985 | Temes et al. | 330/9 |
| 4,659,928 A | * | 4/1987 | Tew | 330/9 |
| 5,497,116 A | * | 3/1996 | Rapeli | 327/337 |
| 5,838,175 A | | 11/1998 | Hsieh | |
| 5,973,518 A | * | 10/1999 | Vallancourt | 327/94 |
| 6,028,459 A | | 2/2000 | Birdsall | |
| 6,198,314 B1 | * | 3/2001 | Kase | 327/94 |
| 6,304,205 B1 | | 10/2001 | Rezvani | |
| 6,369,744 B1 | | 4/2002 | Chuang | |
| 6,384,758 B1 | | 5/2002 | Michalski | |

* cited by examiner

*Primary Examiner*—Toan Tran
(74) *Attorney, Agent, or Firm*—Koppel, Jacobs, Patrick & Heybl

(57) ABSTRACT

Switched-capacitor structures are provided that reduce distortion and noise in their processed signals because they increase isolation between structural elements and ensure that selected elements are securely and quickly turned off and on in different modes.

19 Claims, 6 Drawing Sheets

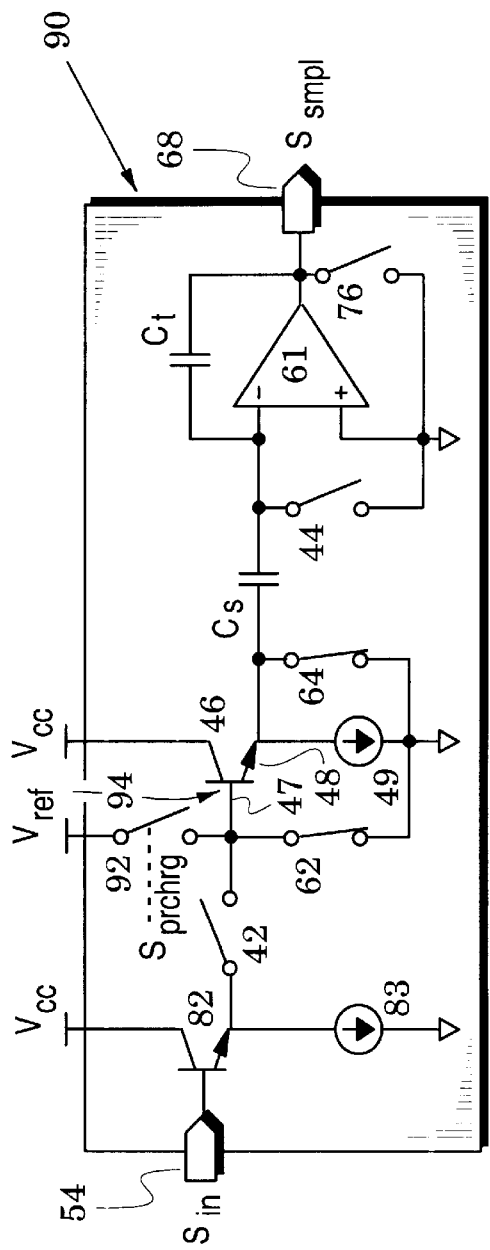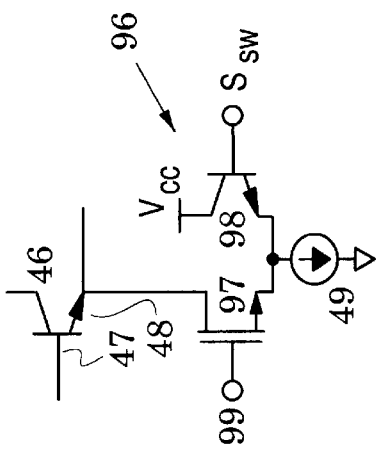

US 6,570,411 B1

SWITCHED-CAPACITOR STRUCTURES WITH REDUCED DISTORTION AND NOISE AND ENHANCED ISOLATION

BACKGROUND OF THE INVENTION

1. Field of the Invention

The present invention relates generally to switched-capacitor structures.

2. Description of the Related Art

FIGS. 1A and 1B illustrate a conventional switched-capacitor structure 10 in which a sample capacitor $C_s$ has a top plate 11 coupled to the inverting input of a differential amplifier 12 and a bottom plate 13 coupled through a first sample switch 14 to an input port 15. The differential amplifier 12 drives an output port 16 and a transfer capacitor $C_t$ is coupled across the differential amplifier. The differential amplifier has a high gain so that its non-inverting input has substantially the same potential as its inverting input. Finally, a second sample switch 17 and a transfer switch 18 are respectively coupled to the top and bottom plates 11 and 13. The first and second sample switches 14 and 17 and the transfer switch 18 are generally realized with transistors.

FIG. 1A illustrates a sample operation of the switched-capacitor structure 10 in which the first and second sample switches 14 and 17 are closed so that an analog input signal $S_{in}$ at the input port 15 urges an electrical sample charge $Q_s$ into the sample capacitor $C_s$ to thereby generate a sample signal $S_s = Q_s/C_s$ across the sample capacitor.

FIG. 1B illustrates a transfer operation of the switched-capacitor structure 10 in which the first and second sample switches 14 and 17 are opened and the bottom plate 13 is grounded through the closed transfer switch 18. Because the signal across the sample capacitor $C_s$ is now substantially zero, the sample charge $Q_s$ is transferred into the transfer capacitor $C_t$ to generate an output processed signal $S_{prcsd} = Q_s/C_t$ at the output port 16. The sample and transfer operations of FIGS. 1A and 1B thereby generate a $S_{prcsd}/S_{in}$ transfer function of $C_s/C_t$. Accordingly, this transfer function is represented in the graph 20 of FIG. 1C by a plot 22 which has a slope of $C_s/C_t$.

The switched-capacitor structure 20 of FIGS. 1A and 1B is thus especially suited for use as a sampler 32 in the pipelined analog-to-digital converter (ADC) 30 of FIG. 1D. The sampler 32 processes an analog input signal $S_{in}$ at an input port 33 into a sampled signal $S_{smpl}$ at a system node 34. In response, an initial ADC stage 35 (e.g., a flash ADC) converts this sampled signal $S_{smpl}$ into at least one most-significant bit $D_o$ of a digital output signal that corresponds to the input signal $S_{in}$. At the same time, the sampled signal is processed into a residue signal $S_{res}$ that is suitable for subsequent processing by downstream ADC stages into the less-significant bits of the output digital signal.

If the initial ADC stage is a 1.5 bit converter stage, for example, it provides decision signals 36 that are equally spaced from the midpoint of the range of the input signal $S_{in}$. In response, the residue signal $S_{res}$ is preferably represented by a plot 24 in FIG. 1C that has three segments defined by the decision signals and has a slope in each segment that is twice the slope of the plot 22.

The plot 24 can be generated, for example, by supplementing the sample capacitor $C_s$ of FIGS. 1A and 1B with an additional sample capacitor to realize the increased slope (i.e., increased gain) and by designing the transfer switch 18 so that it responds to the decision signals (36 in FIG. 1D) by applying selected offset signals to the bottom plates of the sample capacitors. When the switched-capacitor structure 20 of FIGS. 1A and 1B is modified in this fashion, it is typically referred to as a multiplying digital-to-analog converter (MDAC) which is indicated in FIG. 1D as an MDAC 38.

Although switched-capacitor structures are especially suited for accurate realization with integrated-circuit photo-lithographic techniques, their isolation from input circuits has generally been less than desired and their output signals have often exhibited excessive distortion and noise.

BRIEF SUMMARY OF THE INVENTION

The present invention is directed to switched-capacitor structures that increase upstream and downstream isolation between structural elements and ensure that selected elements are securely and quickly turned off and on in different modes. Accordingly, they reduce distortion and noise in their processed signals.

The novel features of the invention are set forth with particularity in the appended claims. The invention will be best understood from the following description when read in conjunction with the accompanying drawings.

BRIEF DESCRIPTION OF THE DRAWINGS

FIG. 4A is a schematic diagram of another switched-capacitor embodiment;

FIG. 4B illustrates a current-steering structure in the embodiment of FIG. 4A;

DETAILED DESCRIPTION OF THE INVENTION

Figure 1B:
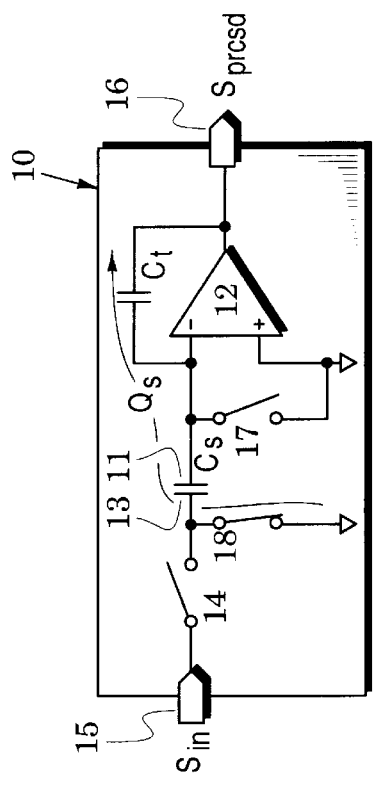
FIGS. 1A and 1B are schematic diagrams that respectively show a conventional switched-capacitor structure in a sample mode and a transfer mode.
Figure 1A:
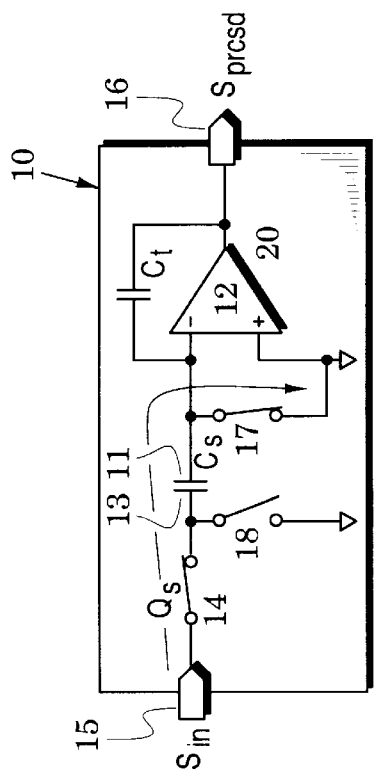
Figure 1D:
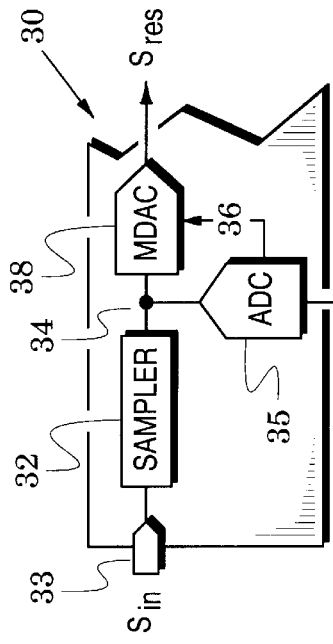
FIG. 1D illustrates a pipelined ADC that includes the switched-capacitor structure of FIGS. 1A and 1B.
Figure 2A:
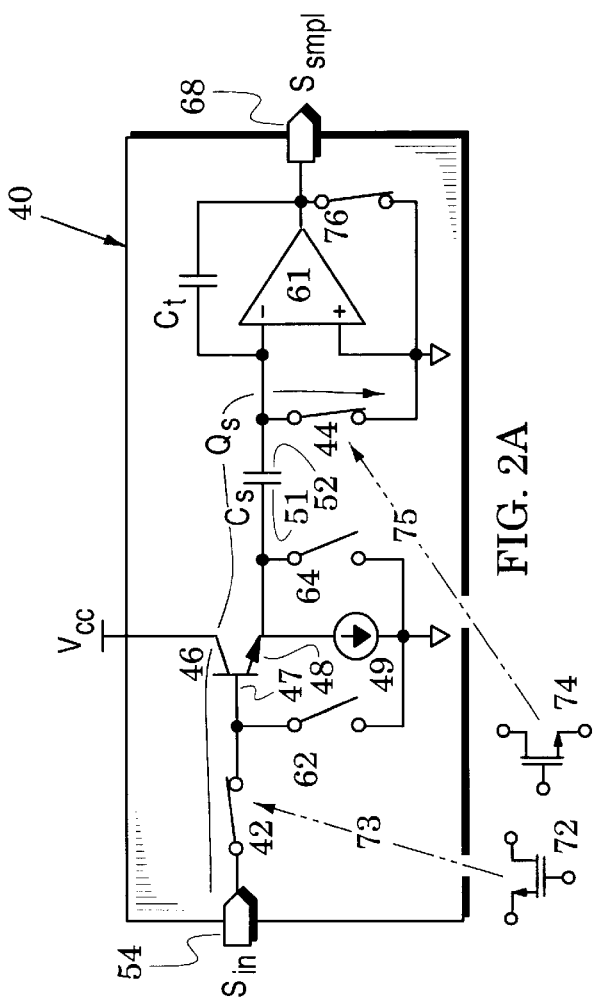
FIGS. 2A and 2B are schematic diagrams that respectively show a switched-capacitor embodiment of the present invention in a sample mode and a transfer mode.
Figure 2B:
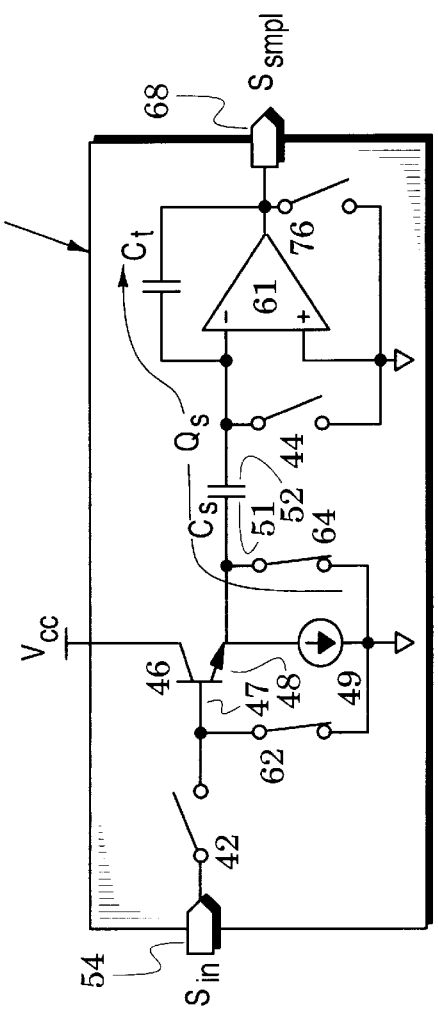

FIGS. 2A and 2B illustrate a switched-capacitor embodiment 40 which is suitable for sampling an analog input signal $S_{in}$ in a sample mode of operation and providing a sample signal $S_{smpl}$ at an output port during a transfer mode of operation. When used as a sampler (e.g., as shown in FIG. 1D), the embodiment 40 effectively reduces distortion and noise in sampler elements and enhances and ensures upstream isolation.

In particular, the sampler 40 includes first and second sample switches 42 and 44 and a buffer transistor 46 which has a control terminal 47 coupled to the first sample switch 42 and has a current terminal 48 that is responsive to the control terminal 47. The current terminal is coupled to a current source 49 and another current terminal is coupled to a bias voltage (e.g., $V_{cc}$). A sample capacitor $C_s$ has a bottom plate 51 coupled to the current terminal 48 and a top plate 52 coupled to the second sample switch 44. The first sample switch 42 is coupled to a sampler input port 54 to receive an analog input signal $S_{in}$.

In addition, the inverting input of a differential amplifier 61 is coupled to the top plate 52, a transfer capacitor $C_t$ is coupled about the differential amplifier, and first and second transfer switches 62 and 64 are respectively coupled to the control terminal 47 and the current terminal 48. The output of the differential amplifier 61 provides a sample signal $S_{smpl}$ at a sampler output port 68. Although not specifically shown, an initial stage of the differential amplifier is preferably formed with a differential pair of transistors.

FIG. 2A illustrates the sample mode of operation in which the first and second sample switches 42 and 44 are closed so that the analog input signal $S_{in}$ urges an electrical sample charge $Q_s$ through the buffer transistor 46 to thereby generate a sample signal $S_s=Q_s/C_s$ across the sample capacitor. During the sample mode, the first and second transfer switches 62 and 64 are set in their open states.

FIG. 2B illustrates the transfer mode of operation in which the first and second transfer switches 62 and 64 are closed to respectively bias off the buffer transistor 46 and transfer the sample charge $Q_s$ to the transfer capacitor $C_t$ to generate an output processed signal $S_{prcsd}=Q_s/C_t$ at the output port 16. During the transfer mode, the first and second sample capacitors 44 and 46 are set in their open states.

The sampler 40 also preferably includes a discharge switch 76 which is coupled to the output of the differential amplifier 61. The discharge switch 76 is closed at the end of the transfer mode to clear charges from the transfer capacitor $C_t$ and prepare it for reception of a new charge in the succeeding transfer mode. Accordingly, the discharge switch 76 is closed in FIG. 2B and open in FIG. 2A.

In FIGS. 2A and 2B, the buffer transistor 46 is shown as a bipolar junction transistor so that the control and current terminals 46 and 48 are respectively a base and an emitter and the buffer stage is an emitter follower stage. The teachings of the invention may be practiced, however with other buffer transistors (e.g., a metal-oxide semiconductor (MOS) transistor).

In order to enhance understanding of the operational processes of the sampler 40, the sample and transfer switches of FIGS. 2A and 2B are indicated with conventional switch symbols. In practice, however, the sample and transfer switches of FIGS. 2A and 2B are preferably realized with MOS transistors as exemplified by first and second n-type MOS sample transistors 72 and 74 of FIG. 2A which replace the first and second sample switches 42 and 44 as respectively indicated by replacement arrows 73 and 75.

It has been found that the operation of conventional samplers is often degraded by spurious charges that are injected into the "on resistance" of a transistor that lies in the sample signal path (i.e., the path defined by the sample charge $Q_s$ in FIG. 2A). It has been determined, for example, that gate movement in the second sample transistor 74 (e.g., when the gate potential is varied to turn the transistor off in order to exit the sample mode) injects an electrical charge upstream to where it passes through the "on resistance" of the first sample transistor 72 and thereby generates a varying signal that distorts the sample charge $Q_s$.

In contrast to conventional structures and in accordance with a feature of the present invention, however, the sampler 40 inserts the buffer transistor 46 into the signal path to separate the first and second sample transistors 72 and 74. The low downstream-to-upstream gain of this emitter follower significantly reduces the injected charge that reaches the first sample transistor 72 and thus significantly reduces the associated distortion. The buffer transistor 46 provides a low-noise, low-distortion signal path for the sample charge $Q_s$ and a fast switching process for transitioning to the transfer mode.

Accuracy of the sampling process requires that a high upstream isolation is realized during the transfer of the sample charge $Q_s$ into the transfer capacitor $C_t$ (as shown in FIG. 2B). In another feature of the present invention, this upstream isolation is enhanced by the series combination of the buffer transistor 46 and the first sample switch 42.

This enhancement is only realized, however, if the buffer transistor 46 is fully turned off during the transfer mode. In accordance with another feature of the present invention, the first transfer switch 62 pulls down the control terminal 47 and thereby ensures that the buffer transistor 46 is securely turned off. Because the control terminal is held at a low potential, the buffer transistor will remain off even as different potentials are presented through the second transfer switch 64 to the current terminal 48. A reason for such different potentials is described below with reference to the switched-capacitor structure of FIG. 5.

Figure 3A:
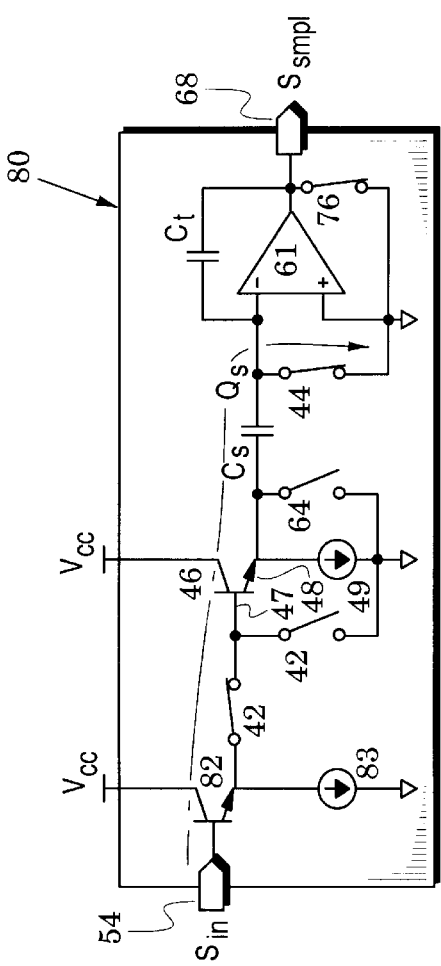
FIGS. 3A and 3B are schematic diagrams that respectively show another switched-capacitor embodiment in a sample mode and a transfer mode.
Figure 3B:
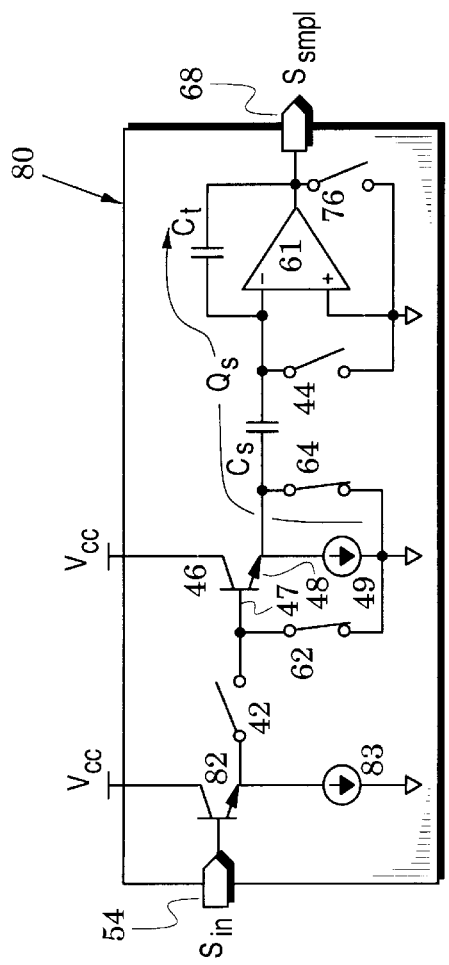

Although the sampler 40 of FIGS. 2A and 2B effectively reduces distortion in series sampler elements and enhances and ensures upstream isolation, it may inject electrical charges into the input port 54 as a result of gate movement on the first sample transistor 72. Because this injected charge may degrade the operation of some upstream systems, the sampler 80 of FIGS. 3A and 3B inserts a second buffer transistor 82 (and a corresponding current source 83) ahead of the first sample switch 42. In another feature of the present invention, the low downstream-to-upstream gain of the second buffer substantially reduces the injected charge that reaches upstream systems. Except for the second buffer transistor 82, FIGS. 3A and 3B are similar to FIGS. 2A and 2B with like elements indicated by like reference numbers.

It has been found, however, that the buffer transistor 46 requires a significant upstream charge current. The charge current is required to recharge the base region of the buffer transistor 46 as the sampler operation transitions from the transfer mode to the sample mode. The current of the current source 49 may be substantial so that the buffer transistor can drive the sample capacitor $C_s$ with low distortion at high frequencies. Accordingly, an injected portion of this recharge current may be large enough to degrade the operation of upstream systems.

FIG. 4A, therefore, illustrates a sampler 90 that incorporates another feature of the present invention. In this sampler, a precharging switch 92 is coupled to the control terminal 47 of the buffer transistor to permit the injection of a precharging current 94. The precharging current 94 quickly charges the base region of the buffer transistor 46 to enhance its performance in the subsequent sample operational mode. The first and second sample switches 42 and 44 and the first and second transfer switches 62 and 64 are shown in FIG. 4A in their transfer mode positions (i.e., similar to their positions in FIGS. 2B and 3B). At the end of the transfer mode, the first and second transfer switches 62 and 64 are opened.

It has been suggested that the current source 49 of FIG. 4A be turned off in the transfer mode so that it does not disturb the sample charge $Q_s$ in the sample capacitor $C_s$. In contrast to this suggestion, the current source 49 is constant in embodiments of the present invention and, rather, its current is selectively steered along first and second paths by the differential pair 96 of transistors 97 and 98 shown in FIG. 4B. The transistor 97 is preferably a CMOS transistor that responds to a fixed bias 99 and the transistor 98 is preferably a bipolar junction transistor that responds to a switch signal $S_{sw}$.

When the switch signal $S_{sw}$ is in a low state in the sample mode, the current is steered by the transistor 97 along a first path that includes the buffer transistor 46. When the switch signal $S_{sw}$ is in a high state in the transfer mode, the current is steered by the transistor 98 along a second path (e.g., to $V_{CC}$) that excludes the buffer transistor 46. In another feature of the invention, the high transconductance $g_m$ of the transistor 98 significantly enhances the speed of initiating and terminating current flow through the buffer transistor 46.

In an exemplary timing sequence of the invention, the first and second transfer switches 62 and 64 are opened at the end of the transfer mode and the second sample switch 44 is subsequently closed to initiate the sample mode. Next, the differential pair 96 (in FIG. 4B) steers current through the buffer transistor 46 and the precharging switch 92 is closed to inject the precharging current 94 into the base region of the buffer transistor 46. The first sample switch 42 is then closed and, subsequently, the precharging switch 92 is opened to terminate injection of the precharging current 94.

The second sample switch 44 is opened at the end of the sample mode to fix the sample charge Qs in the sample capacitor Cs. Subsequently, the first sample switch 42 is opened and the differential pair 96 (in FIG. 4B) steers current away from the buffer transistor 46 and the sample capacitor Cs and, subsequent to these operations, the first and second transfer switches 62 and 64 are turned on to initiate the subsequent transfer mode.

Figure 5:
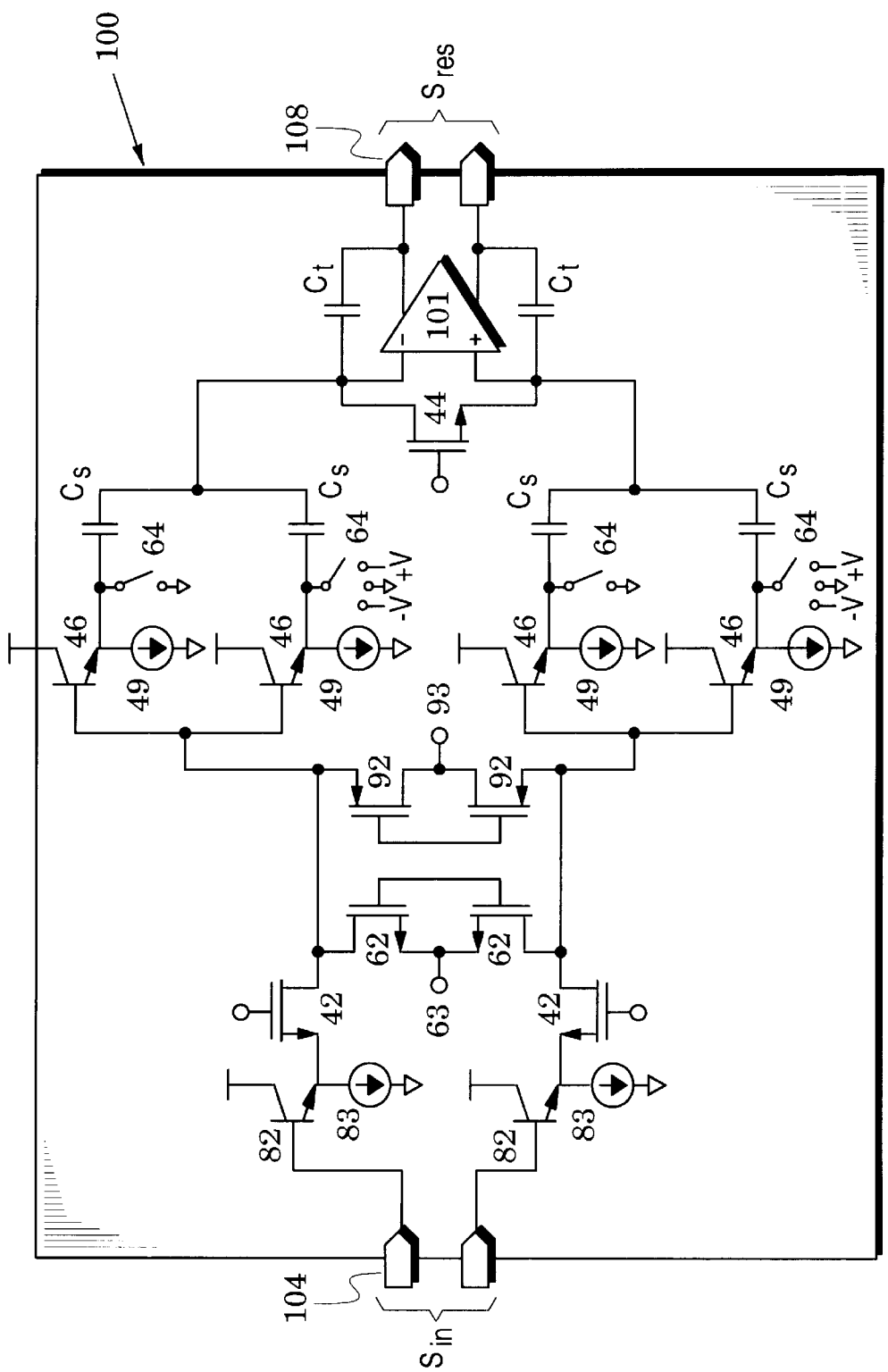
FIG. 5 is a schematic diagram of a differential switched-capacitor embodiment.

FIG. 5 illustrates a differential version 100 of the sampler 90. In this version, the input port 54 of FIG. 4A is replaced by a differential input port 104 and the amplifier 61 is replaced by a differential amplifier 101 that differentially drives a differential output port 108. Differential upper and lower signal paths are coupled between the differential input port 104 and the differential amplifier 101 and a second buffer transistor 82 (and corresponding current source 83) and a first sample transistor 42 initiate each of these signal paths (the first sample transistor 42 is the same as the first sample transistor 72 of FIG. 2A).

The first transfer switch 62 of FIG. 4A is realized with a pair of first transfer transistors 62 which are driven from a common port 63 and the recharging switch 92 is realized with a pair of recharging transistors 92 which are driven from a common port 93. Although not specifically shown in FIG. 5, the discharge switch 76 of FIG. 4A can be coupled across the differential output port 108. A pair of transfer capacitors $C_t$ are coupled about the differential amplifier 101 and a second sample transistor 44 is coupled across the input of this amplifier (the second sample transistor 44 is the same as the second sample transistor 74 of FIG. 2A).

Figure 1C:
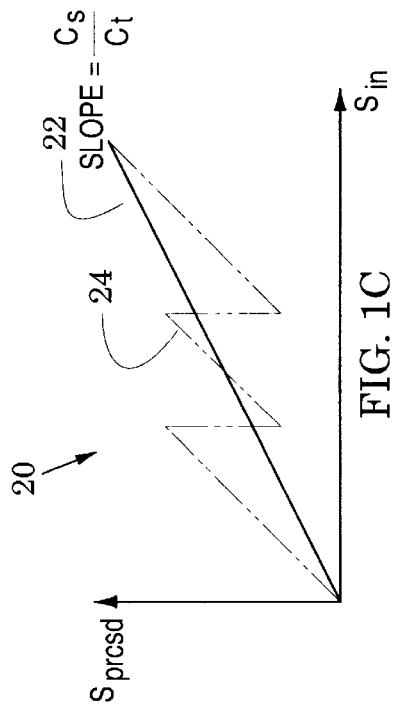
FIG. 1C is a graph that illustrates responses of the switched-capacitor structure of FIGS. 1A and 1B.

In contrast, however, the buffer transistor 46 (and associated current source 49), the second transfer switch 64 and the sample capacitor $C_s$ are arranged in a parallel arrangement in both of the upper and lower signal paths. This arrangement provides an additional sample capacitor $C_s$ that realizes an increased transfer-function slope (e.g., as shown by the plot 24 of FIG. 1C) and provides an additional second transfer switch 64 that can switch multiple switch terminals to the current terminal of a corresponding second transfer switch to thereby facilitate application of selected offset signals. For simplicity of illustration, the differential pair 96 of FIG. 4B is not shown in FIG. 5.

The switched-capacitor structure 100 of FIG. 5 is therefore especially suited for use as an MDAC in pipelined ADCs (e.g., as shown in FIG. 1D). Accordingly, the signal at its differential output port 108 is shown as a residue signal $S_{res}$. To facilitate this MDAC structure, each of the first transfer switches 62 pulls down the control terminal of respective buffer transistors 46 to ensure they remain off during the transfer mode and thus permit the application of selected offset signals at the bottom plates of respective transfer capacitors $C_t$.

Figure 6:
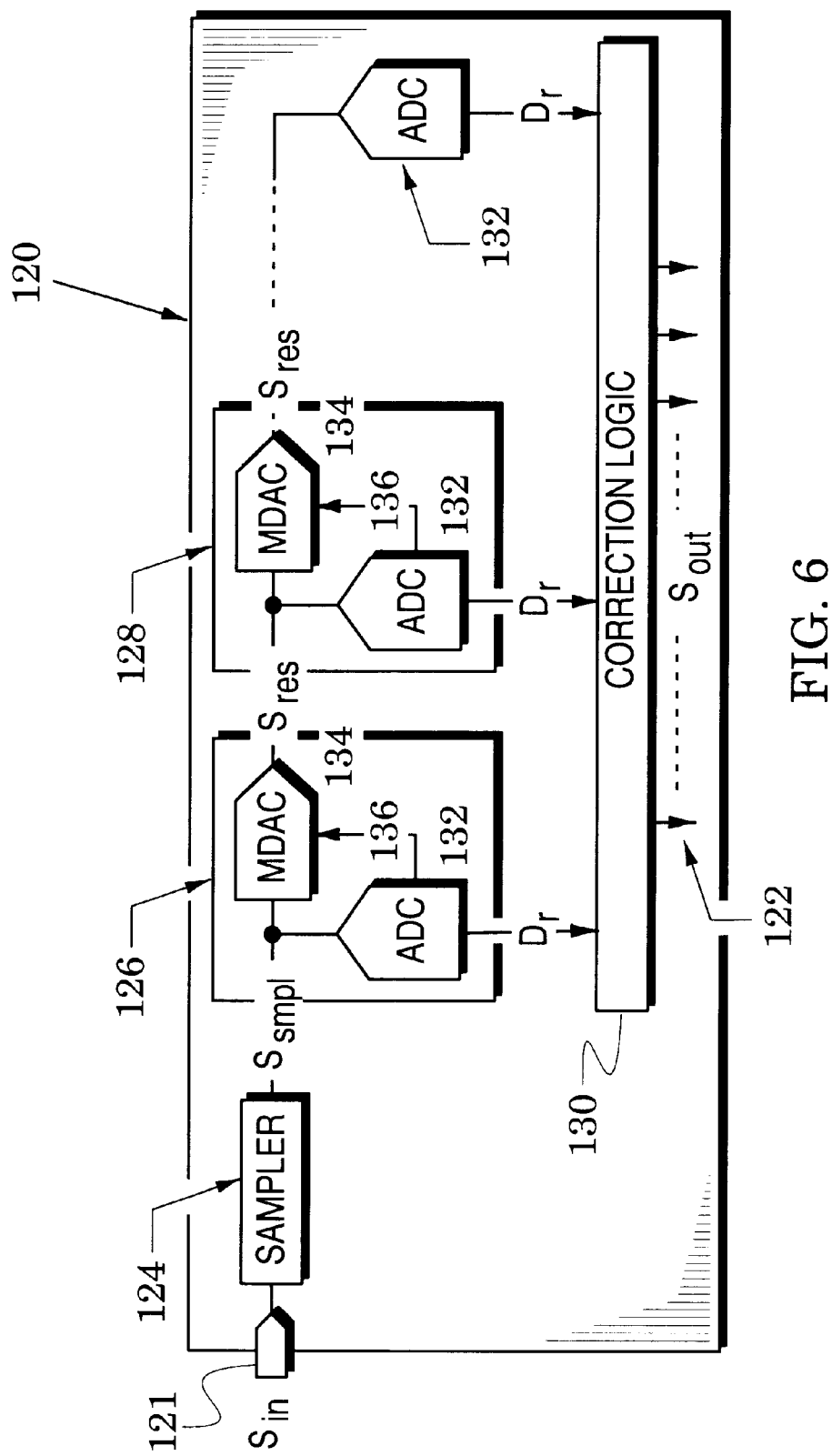
FIG. 6 is a block diagram of a pipelined ADC that can be realized with the switched-capacitor embodiments of FIGS. 2A through 5.

The switched-capacitor structures of the present invention can advantageously be used as samplers and MDACs in a variety of signal conditioning modules such as the pipelined ADC 120 of FIG. 6. The ADC 120 includes a sampler 124, an initial converter stage 126 and at least one successive stage 128 and converts an analog input signal $S_{in}$ at an input port 121 to a corresponding digital output signal $S_{out}$ at an output port 122.

In particular, the sampler 124 provides a sample signal $S_{smpl}$ in response to the input signal $S_{in}$ and the initial converter stage 126 processes the sample signal $S_{smpl}$ to provide a residue signal $S_{res}$ and also provide respective digital bits $D_r$. In a similar fashion, each successive converter stage 128 processes a preceding residue signal $S_{res}$ to provide a successive residue signal $S_{res}$ and also provide respective digital bits $D_r$. However, the final one of the successive converter stage only provides respective digital bits $D_r$. The converter stages of the pipelined ADC 120 generally provide extra digital bits so that the pipelined ADC can include a correction logic 130 which corrects processing errors and generates the digital output signal $S_{out}$.

The initial converter stage 126 has an ADC 132 (e.g., a flash ADC) that converts the sample signal $S_{smpl}$ to respective digital bits $D_r$. The initial converter stage also has an MDAC 134 that receives the sample signal $S_{smpl}$ and also receives a decision signal 136 from the ADC 132. The decision signal indicates which of the respective digital bits $D_r$ is being provided at any given moment by the ADC 132. Although each of the successive converter stages 128 processes a preceding residue signal $S_{res}$ (rather than the sample signal $S_{smpl}$), they are configured similarly to the initial converter stage 126. In contrast, the final converter stage only includes the ADC 132.

Because the switched-capacitor structures of the invention increase isolation between structural elements and ensure that selected elements are securely turned off in one mode and quickly turned on in another mode, they reduce distortion and noise in their processed signals.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. In a switched-capacitor stage that has a buffer transistor and a sample capacitor serially coupled between first and second sample switches that are closed in an operational sample mode and has first and second transfer switches that are closed in an operational transfer mode and are respectively coupled to control and current terminals of said buffer transistor; the improvement comprising:

a second buffer transistor having a control terminal to receive an input signal and a current terminal that is coupled to pass said input signal to said first sample switch.

2. The stage of claim 1, further including a precharging switch coupled to a junction between said first sample switch and said buffer transistor to thereby conduct a precharging current to said second buffer transistor prior to said sample mode.

3. The stage of claim 1, further including a differential pair of transistors that selectively steers a bias current along a first path in said sample mode and a second path in said transfer mode wherein said first path includes said buffer transistor and said second path excludes said buffer transistor.

4. The stage of claim 1, wherein said precharging switch is a metal-oxide semiconductor transistor.

5. The stage of claim 1, wherein said control terminal is a base and said current terminal is an emitter.

6. The stage of claim 1, further including:
  a differential amplifier coupled to said sample capacitor and said second sample switch;
  a transfer capacitor coupled about said differential amplifier; and
  a discharge switch coupled to said transfer capacitor to thereby discharge said transfer capacitor in said sample mode.

7. The stage of claim 1, wherein said second transfer switch is configured to switch multiple switch terminals to said sample capacitor to facilitate application of selected offset signals.

8. In a switched-capacitor stage that has a buffer transistor and a sample capacitor serially coupled between first and second sample switches that are closed in an operational sample mode and has first and second transfer switches that are closed in an operational transfer mode and are respectively coupled to control and current terminals of said buffer transistor; the improvement comprising:
  a precharging switch coupled to a junction between said first sample switch and said buffer transistor, to thereby conduct a precharging current to the control terminal of said buffer transistor prior to said sample mode.

9. The stage of claim 8, further including a differential pair of transistors that selectively steers a bias current along a first path in said sample mode and a second path in said transfer mode wherein said first path includes said buffer transistor and said second path excludes said buffer transistor.

10. The stage of claim 8, wherein said precharging switch is a metal-oxide semiconductor transistor.

11. The stage of claim 8, further including:
  a differential amplifier coupled to said sample capacitor and said second sample switch;
  a transfer capacitor coupled about said differential amplifier; and
  a discharge switch coupled to said transfer capacitor to thereby discharge said transfer capacitor in said sample mode.

12. The stage of claim 8, wherein said second transfer switch is configured to switch multiple switch terminals to said sample capacitor to facilitate application of selected offset signals.

13. In a switched-capacitor stage that has a buffer transistor and a sample capacitor serially coupled between first and second sample switches that are closed in an operational sample mode and has first and second transfer switches that are closed in an operational transfer mode and are respectively coupled to control and current terminals of said buffer transistor; the improvement comprising:
  a differential pair of transistors that selectively steers a bias current along a first path in said sample mode and a second path in said transfer mode wherein said first path includes said buffer transistor and said second path excludes said buffer transistor.

14. The stage of claim 13, further including:
  a differential amplifier coupled to said sample capacitor and said second sample switch;
  a transfer capacitor coupled about said differential amplifier; and
  a discharge switch coupled to said transfer capacitor to thereby discharge said transfer capacitor in said sample mode.

15. The stage of claim 13, wherein said second transfer switch is configured to switch multiple switch terminals to said sample capacitor to facilitate application of selected offset signals.

16. In a pipelined analog-to-digital converter which has a sampler that provides a sample signal in response to an analog input signal and has a buffer transistor and a sample capacitor serially coupled between first and second sample switches that are closed in an operational sample mode and has first and second transfer switches that are closed in an operational transfer mode and are respectively coupled to control and current terminals of said buffer transistor; the improvement comprising:
  an initial converter stage that processes said sample signal to provide a residue signal and respective bits of a digital output signal that corresponds to said analog input signal;
  at least one successive converter stage that processes a preceding residue signal to provide a successive residue signal and respective bits of said digital output signal wherein a final converter stage only provides said respective bits;
  a second buffer transistor having a control terminal to receive an input signal and a current terminal that is coupled to pass said input signal to said first sample switch;
  a precharging switch coupled to a junction between said first sample switch and said buffer transistor to thereby conduct a precharging current to said second buffer transistor prior to said sample mode; and
  a differential pair of transistors that selectively steers a bias current along a first path in said sample mode and a second path in said transfer mode wherein said first path includes said buffer transistor and said second path excludes said buffer transistor.

17. The converter of claim 16, wherein said precharging switch is a metal-oxide semiconductor transistor.

18. The converter of claim 16, wherein said control terminal is a base and said current terminal is an emitter.

19. The converter of claim 16, further including:
  a differential amplifier coupled to said sample capacitor and said second sample switch;
  a transfer capacitor coupled about said differential amplifier; and
  a discharge switch coupled to said transfer capacitor to thereby discharge said transfer capacitor in said sample mode.

* * * * *